US008252636B2

(12) United States Patent
Dornel et al.

(10) Patent No.: US 8,252,636 B2
(45) Date of Patent: Aug. 28, 2012

(54) METHOD OF MANUFACTURING NANOWIRES PARALLEL TO THE SUPPORTING SUBSTRATE

(75) Inventors: Erwan Dornel, Grenoble (FR); Jean-Charles Barbe, Grenoble (FR); Thomas Ernst, Morette (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 12/267,431

(22) Filed: Nov. 7, 2008

(65) Prior Publication Data

US 2009/0124050 A1    May 14, 2009

(30) Foreign Application Priority Data

Nov. 9, 2007  (FR) ..................... 07 58933

(51) Int. Cl.
*H01L 21/335* (2006.01)
*H01L 21/8232* (2006.01)
*H01L 29/775* (2006.01)
(52) U.S. Cl. ............... 438/142; 438/962; 257/E21.404; 257/E29.07; 257/E29.245; 977/762; 977/938
(58) Field of Classification Search ............ 438/142, 438/962
See application file for complete search history.

(56) References Cited

U.S. PATENT DOCUMENTS

2004/0166642 A1 * 8/2004 Chen et al. .................. 438/284
2005/0275010 A1   12/2005 Chen et al.
2006/0214212 A1 * 9/2006 Horita et al. ................ 257/300
2007/0222353 A1 * 9/2007 Ren et al. .................... 313/310

FOREIGN PATENT DOCUMENTS

DE    102006012416 A1   10/2006

OTHER PUBLICATIONS

Pennelli et al., "Silicon Single-electron Transistor Fabricated by Anisotropic Etch and Oxidation," Microelectronic Engineering 83:1710-13 (2006).
Preliminary Search Report for International Patent Application No. FR 0758933 (Mar. 10, 2008).
Takashi et al., "Multigate Single-electron Transistors and Their Application to an Exclusive-OR Gate," Applied Physics Letters 76(5):637-9 (2000).
Zhuang et al., "Silicon Single-electron Quantum-dot Transistor Switch Operating at Room Temperature," Applied Physics Letters 72(10):1205-7 (1998).

* cited by examiner

*Primary Examiner* — Charles Garber
*Assistant Examiner* — Calvin Choi
(74) *Attorney, Agent, or Firm* — Nixon Peabody LLP

(57) ABSTRACT

A method of manufacturing at least one nanowire, the nanowire being parallel to its supporting substrate, the method including the formation on the supporting substrate of a structure comprising a bar and two regions, a first end of the bar being secured to one of the two regions and a second end of the bar being secured to the other region, the width of the bar being less than the width of the regions, the subjection of the bar to an annealing under gaseous atmosphere in order to transform the bar into a nanowire, the annealing being carried out under conditions allowing control of the sizing of the neck produced during the formation of the nanowire.

9 Claims, 8 Drawing Sheets

METHOD OF MANUFACTURING NANOWIRES PARALLEL TO THE SUPPORTING SUBSTRATE

CROSS REFERENCE TO RELATED APPLICATIONS OR PRIORITY CLAIM

This application claims priority to French Patent Application No. 07 58933, filed Nov. 9, 2007.

DESCRIPTION

1. Technical Field

The invention relates to a method of manufacturing nanowires parallel to their supporting substrate. This method can in particular apply to the field of microelectronics, in particular for producing nanowire transistors.

2. Prior Art

Nanowires parallel to their supporting substrate have a certain interest in the manufacture of field effect transistors. In this case, a nanowire is connected at its ends to contacts serving as electrodes (source and drain).

The wires can range from a few nanometers in diameter to a few hundreds of nanometers with an optimum at 20 nm. The length of the wires may range from the same as the diameter to 10 times the diameter. The dimensions of the contacts (length and width for a rectangular contact) are greater than the width of the nanowires and may range from 10 nm to several micrometers.

The nanowire is in contact or not with the underlying substrate, through its bottom part. In the case where the nanowire is in contact with the substrate, a "nanowire on substrate" will be spoken of. In the case where the nanowire is not in contact with the substrate, a "free nanowire" will be spoken of.

In the case of application to a transistor in particular, the material constituting the nanowire and the material constituting the contacts are mono-crystalline semiconductors, for example, made from Si, SiGe, Ge, GeAs, AlGaAs or amorphous. The material constituting the nanowire is identical to the material of the contacts. The substrate may consist of a monolayer or a multilayer. In the case of a nanowire on substrate, the top layer of the substrate is a dielectric, for example $SiO_2$ or $Al_2O_3$. In the case of a free nanowire, the top layer for the substrate may be a dielectric (for example) $SiO_2$ or $Al_2O_3$ or a conductor or a semiconductor (for example Si, SiGe, Ge, GeAs, AlGaAs or an amorphous material).

The document US 2005/0275010 discloses a method of manufacturing a nanowire transistor. This transistor is manufactured from an SOI substrate. FIG. 1 shows a transistor structure in the course of manufacture. There can be recognised the silicon support 1 of the SOI substrate and the buried oxide layer 2 and, on this oxide layer, the structure of the transistor produced from the surface layer of silicon of the SOI substrate, the parts 3, 4 and 5 of which remain. The transistor structure comprises a source region 3, a drain region 4 and a channel region 5 in the form of a bar of short length compared with the drain and source regions. The references 6 and 7 designate silicon dioxide zones situated respectively on the source 3 and drain 4 regions. The zones 6 and 7 result from the manufacturing method and may lay completely on the surface of the parts 3, 4 and 5. The zones 6 and 7 will be eliminated subsequently.

FIG. 2 shows the transistor structure at a subsequent manufacturing stage. This structure results from annealing at high temperature. The annealing causes a rearrangement of the silicon atoms. The rearrangement is caused by a surface migration of the silicon atoms due to the tendency to minimise the surface energy. During the annealing, the rearrangement of the atoms at the narrow channel region has the consequence of rounding the corners of the bar forming the channel region. This channel region is then transformed into a nanowire 8.

FIG. 3 shows the transistor structure completed by the formation of a gate 9, interposed between the source 3 and drain 4 regions and enclosing the nanowire 8.

The annealing smoothes and rounds the cross section of the nanowire and ensures reconstruction of the crystalline surface of the nanowire in order to optimise its electrical characteristics. The smoothing reduces the roughness and therefore increases the mobility of the carriers for the electrical charges passing through the nanowire, which serves as a conduction channel. At a strong transverse field (that is to say a field perpendicular to the axis of the nanowire), the charge carriers interact with the roughness of the interface between the wire and the gate dielectric, which degrades their mobility. The rounding of the cross section of the wires makes it possible to no longer have a corner on the wires and therefore to get rid of the phenomenon of multiple triggering of the transistor, the consequence of which is an improvement in the slope of the curve $I_d(V_g)$, referred to as the "slope under the threshold", where $I_d$ is the current between the source and drain contacts (passing through the nanowire) and $V_g$ is the gate voltage.

Annealing therefore rounds the cross section of the nanowire by its surface migration of the silicon atoms. However, there also occurs a migration of the silicon atoms of the nanowire towards the source and drain regions, which are of the same material as the nanowire. There may result from this a phenomenon of pinching of the nanowire (referred to as "nanowire necking" in English terminology).

This migration phenomenon is illustrate by FIGS. 4A to 4C, which are plan views of a substrate 11 supporting a bar 12, the ends of which are connected to drain 13 and source 14 regions. FIG. 4A shows the structure before annealing. This structure is therefore similar to that of FIG. 1.

During annealing, as shown by FIG. 4B, necking 16 of the nanowire 15 may occur at its two ends, that is to say close to the source 13 and drain 14 contacts. The necking of the nanowires is a problem since it creates additional access resistance. The necking thus degrades the performance of the transistors. The necking may lead, if the annealing continues, to the rupture of the nanowire at the points referenced 17 (see FIG. 4C). There is then no longer any electrical connection between the wire 15 and the source 13 and drain 14 contacts. The result is a total loss of the functionality of the transistor.

To remedy the phenomenon of necking of the nanowire, the document US 2005/0275010 recommends the insertion of a masked zone on at least one of the source and drain regions. The mask comprises a material towards which the silicon atoms do not migrate, such as silicon nitride, silicon oxynitride or silicon dioxide. Since the silicon atoms do not have a tendency to migrate towards the masked regions, the quantity of atoms that actually migrate is limited and consequently the necking is also limited.

The solution recommended by the document US 2005/0275010 does however have the drawback of having to produce masks on the source and drain regions, these masks being able to be multilayer, which involves additional steps in the manufacturing; method (deposition, etching, elimination).

To summarise the various states of the nanowire (or nanobar) before annealing, according to the prior art, there may be found:

a nanowire on a substrate of a single level, a free nanowire of a single level, this state requiring the use of a sacrificial material, nanowires on several levels where the lower wire is on the substrate (with a matrix organisation), nanowires on several levels where the lower wire is free (with a matrix organisation), a state that also requires the use of a sacrificial material.

During an annealing, a wire on substrate will remain on the substrate, while a free wire will remain free.

DISCLOSURE OF THE INVENTION

The inventors of the present invention have discovered that it is possible to control the sizing of the necking caused on nanowires by an annealing. It is then possible to provide for the sizing of the necking according to the types of material used and the annealing conditions (annealing temperature, duration of annealing, nature and pressure of the gas present during the annealing).

An object of the invention is a method of manufacturing at least one nanowire, the nanowire being parallel to its supporting substrate, the method comprising:

the formation on the supporting substrate of a structure comprising a bar and two regions, a first end of the bar being secured to one of the two regions and a second end of the bar being secured to the other region, the width of the bar being less than the width of the regions, the subjection of the bar to annealing under gaseous atmosphere in order to transform the bar into a nanowire, characterised in that the annealing is carried out under conditions allowing control of the sizing of at least one necking occurring on the nanowire during its formation, the radius of the nanowire at the necking then being determined by the graph in FIG. 6, for which:

$r_{neck}$=radius of the nanowire at the necking
$r_0$=initial radius of the nanowire
t=annealing time $$B = D_s \cdot v \cdot \gamma \cdot \Omega^2 / k_B \cdot T$$

with:

$D_s$=surface diffusion coefficient of the material of the nanowire v=number of surface atoms of the nanowire per unit surface, γ=surface energy of the nanowire
Ω=atomic volume of the atoms of the nanowire
$k_B$=Boltzman's constant
T=annealing temperature.

According to a particular embodiment, annealing is carried under conditions also allowing control of the location of the neck or necks during the formation of the nanowire, the location of the neck or necks then being determined by the graph in FIG. 8, for which:

$L_{neck}$ is the distance between a neck and the region of the structure closest to the neck, $L_{wire}$ being the length of the nanowire, by means of which there is formed either a single neck at the middle of the nanowire or a double neck.

According to another particular embodiment, the formation on the supporting substrate of the structure comprising a bar and two regions causes the creation of a splay at each end of the bar in its connection with the two regions. The splay can take place at an angle of 45° on each edge of the nanowire.

Another object of the invention is a method of manufacturing at least one nanowire transistor, comprising:

the implementation of the above method of manufacturing at least one nanowire, one of the regions of the structure being designed to constitute the drain of the transistor, the other region of the structure being designed to constitute the source of the transistor, the formation of at least one gate for the transistor on the nanowire at the location of the said at least one neck.

This method of manufacturing a nanowire transistor allows the manufacture of a transistor comprising a nanowire having a single neck and a single gate covering the single neck. It also allows the manufacture of a transistor comprising a nanowire having two necks and a single gate covering the two necks. It also allows the manufacture of a transistor comprising a nanowire having two necks and two gates, a first gate covering a first neck and a second gate covering a second neck.

BRIEF DESCRIPTION OF THE DRAWINGS

The invention will be better understood and other advantages and particularities will emerge from a reading of the following description given by way of non-limiting example accompanied by the attached drawings, among which.

DETAILED DISCLOSURE OF PARTICULAR EMBODIMENTS

The control of the sizing of the neck on the nanowire during annealing relies on simulations by the "MoveFilm" numerical tool developed at the Commnissariat à l'Energie Atomique (France). The bases of this numerical code applied to films are disclosed in the article "Surface diffusion dewetting of thin solid films: Numerical method and application to Si/SiO$_2$" by E. Dornel et al, Physical Review B 73, 115 427 (2006).

This code has been modified in order to be able to simulate the effects of the annealing (rounding and necking) on free nanowires (having symmetry of rotation) and thus provide for the sizing of the neck according to the experimental conditions, namely the type of material and the annealing conditions (annealing temperature, annealing time, nature of the gas and pressure of the gas). The effect of the necking simulated by "MoveFilm" is presented in FIG. 5B. The radius of the wire at the neck (this is the point of the minimum radius of the nanowire) is denoted $r_{neck}$ and the distance between the neck and the closest contact is denoted $L_{neck}$. The quantification of the necking $L_{neck}$ as a function of time is presented in FIG. 6.

Figure 5A:
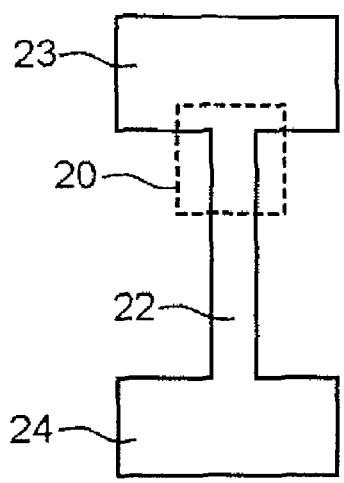
FIG. 5B shows the necking effect due to the annealing on a detail of the FIG. 5A.
Figure 5B:
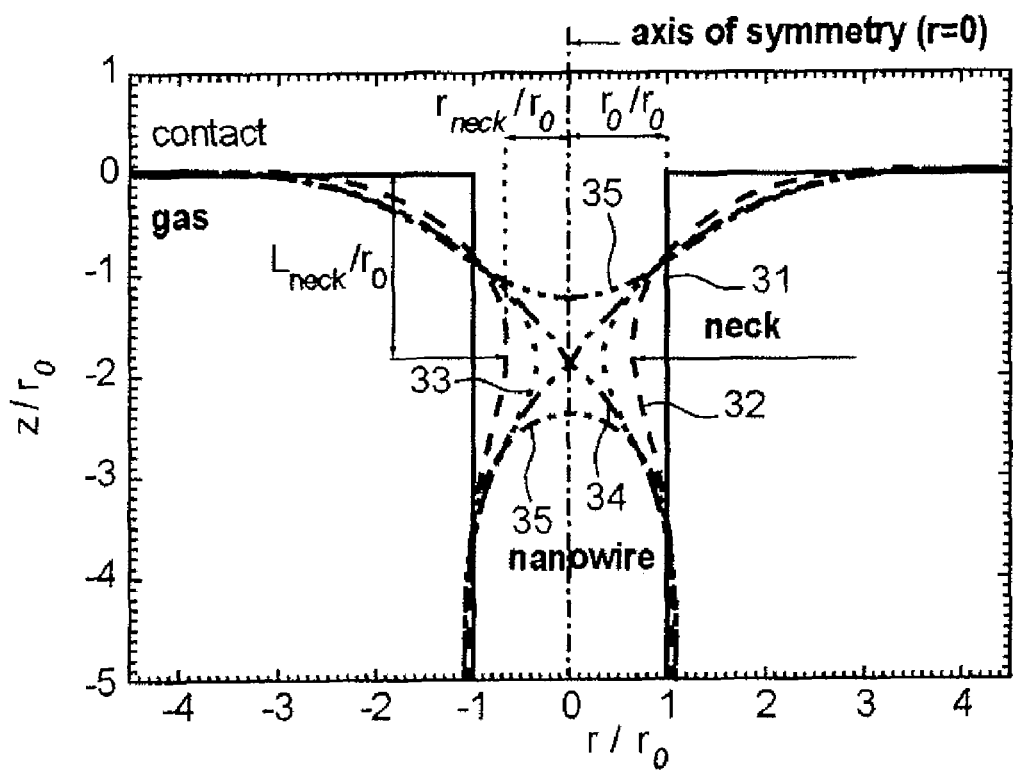
Figure 6:
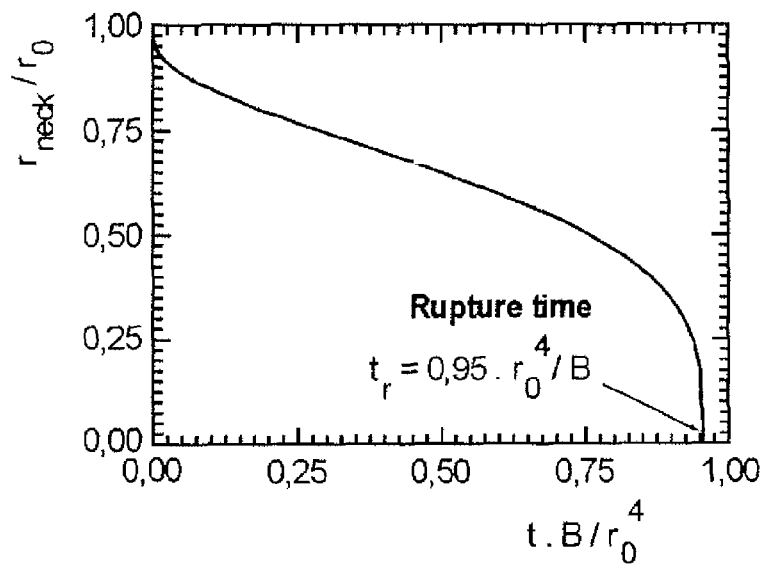
FIG. 6 is a graph representing the quantification of the necking as a function of time.

The graphs in FIGS. 5B and 6 enable the experimenter to size the neck of the nanowire as a function of space and time: the space dimensions are found homothetically and the timescale is given by the factor $B/r_0^4$, or $B=D_s \cdot v \cdot \gamma \cdot \Omega^2/k_B T$, where $D_s$ is the surface diffusion coefficient of the element making up the wire, $v$ is the number of surface atoms per unit surface, $\gamma$ is the surface energy of the nanowire, $\Omega$ is the atomic volume of the atoms making up the nanowire, $k_B$ is Boltzmann's constant and T is the temperature. (If the material of the nanowire is composed of several chemical elements (for example an alloy), the parameters $D_s$, $v$, $\gamma$ and $\Omega$ take as their values the values of the corresponding composite material). For example, if the initial radius of the wire is multiplied by 2, the minimum radius of the wire $r_{neck}$ is multiplied by 2 and the timescale is multiplied by $2^4$, that is to say by 16. The experimenter can calculate the coefficient B, which is entirely determined by the parameters of the material chosen by himself. For example, on the basis of the experimental work of K. Sudoh et al ("Numerical Study on Shape Transformation of Silicon Trenches by High-Temperature Hydrogen Annealing". Jap. J. of Appl. Phys., vol 43 No 9A, 2004, pages 5937 to 5941), it is possible to extract a coefficient B of $3.8 \times 10^{-8}$ $\mu m^4 \cdot s^{-1}$ at 800° C. and around $4.3 \times 10^{-2}$ $\mu m^4 \cdot s^{-1}$ at 1100° C., for silicon, and a hydrogenated atmosphere with a pressure of 10 Torr. For example, if the experimenter chooses a material with a surface energy of 1 $J \cdot m^{-2}$ the timescale will be divided by 2 with respect to a material with a surface energy of 0.5 $J \cdot m^{-2}$ (since the coefficient B is multiplied by 2). The temperature of the annealing can also be determined by means of the coefficient B; assuming that the surface diffusion coefficient can be written according to the Arrhenius law: $D_s = D_0 \cdot exp(-E_a/(K_B T))$, if for example the activation energy $E_a$ of the material chosen by the user is 2.0 eV, the increase in the temperature from 850° C. to 880° C. causes a multiplication of the factor B by 2 and therefore the time is divided by a factor of 2.

At the first moment of the annealing, the bar changes from a square or rectangular cross section to a circular cross section. $r_0$ represents the radius of the cross section of the circular nanowire before necking. The invention relates to the change in this circular cross section.

Figure 1:
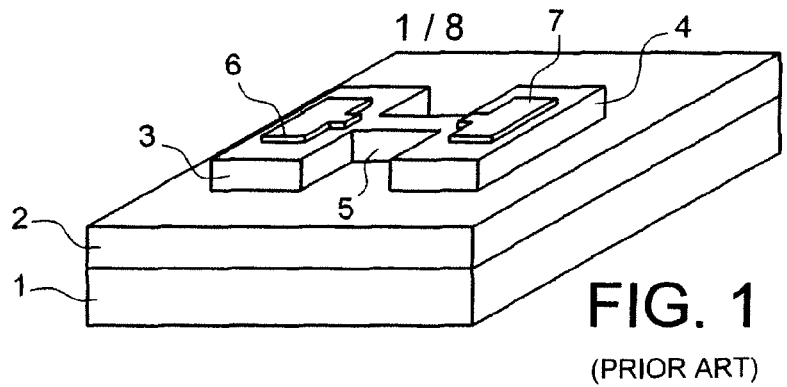
FIG. 1, already described, shows a nanowire transistor structure according to the known art during manufacture, FIG. 2, already described, shows the nanowire transistor structure of FIG. 1 at a subsequent stage of manufacture, according to the known art, FIG. 3, already described, shows the nanowire transistor structure of FIG. 2 completed by the formation of a gate, according to the known art, FIGS. 4A to 4C, already described, are plan views of a substrate supporting a bar, intended for the formation of a nanowire, the ends of which are connected to drain and source regions, illustrating the phenomenon of migration of the nanowire atoms during formation, FIG. 5A repeats the structure shown in FIG. 4A
Figure 2:
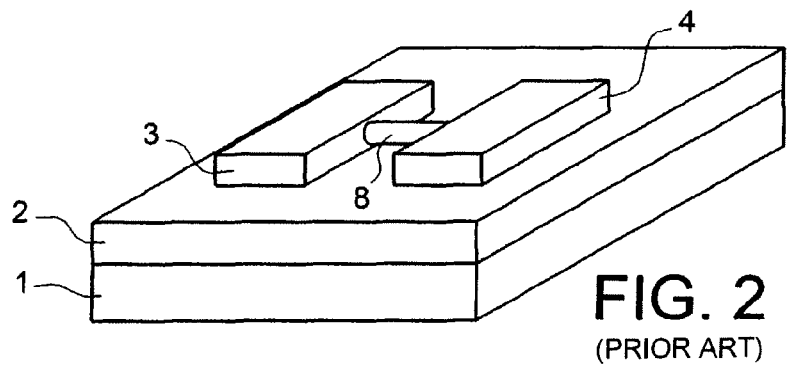
Figure 3:
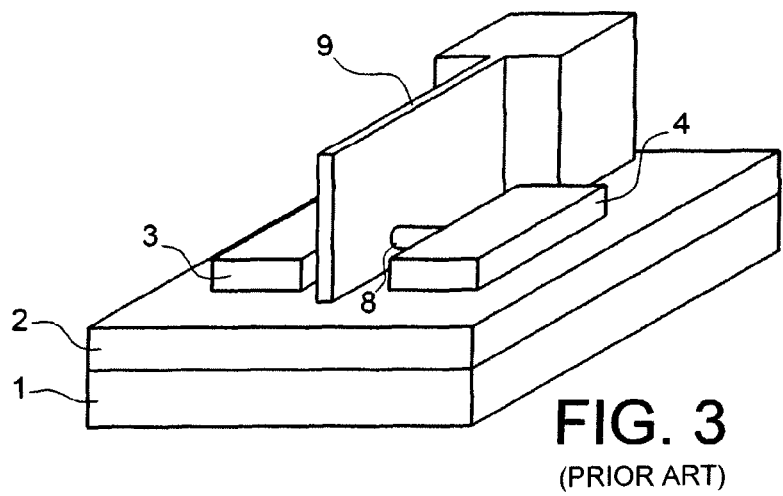
Figure 4A:
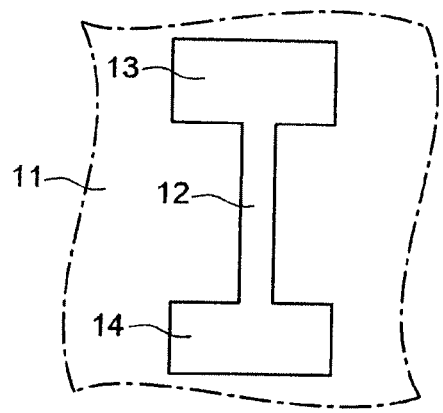
Figure 4B:
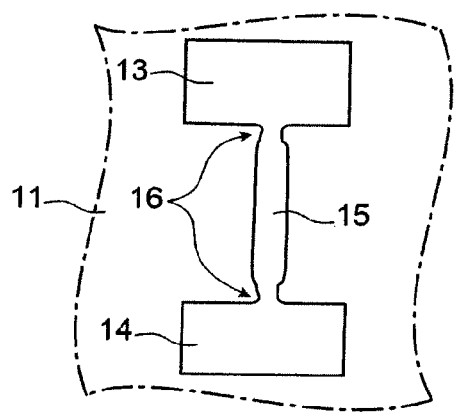
Figure 4C:
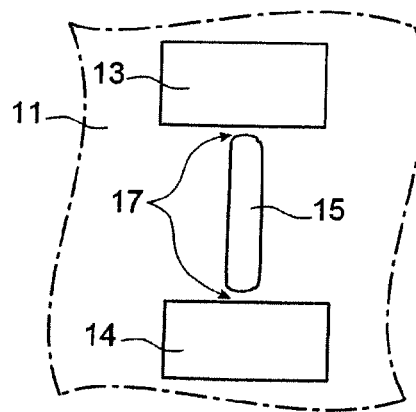

FIG. 5A repeats the structure shown in FIG. 4A. It shows a nanowire 22 in the course of formation, the ends of which are connected to drain 23 and source 24 regions, whereby the regions are uncovered during the annealing. The reference 20 represents the zone whose change during the annealing is detailed in FIG. 5B. The same necking phenomenon is manifested at the other end of the nanowire close to the contact or source region 24.

FIG. 5B depicts the profile of the surface of the end of a free nanowire 22, connected to the drain region 23 or contact in the case of a long free wire, obtained at different annealing times. The continuous line 31 corresponds to the initial surface of the nanowire. The broken line 32 corresponds to the time $t=0.5$ $r_0^4/B$. The broken line 33 corresponds to time $t=0.9$ $r_0^4/B$. The broken line 34 corresponds to the time $t=0.955$ $r_0^4/B$. The broken line 35 corresponds to the time $t=r_0^4/B$.

The characteristic quantities are: $r_0$, which represents the initial radius of the wire, $r_{neck}$, which represents the radius of the wire at the constriction zone (necking), and $L_{neck}$, which represents the distance of the constriction zone with respect to the initial position of the edge of the closest contact zone.

FIG. 6 illustrates the minimum of the radius of the wire (at the neck) $r_{neck}$, as a function of the time t, the coefficient B and the initial radius of the wire $r_0$. This graph relates to the nanowire simulated in FIG. 5A. $t_r$ represents the time where $r_{neck}=0$, that is to say when the wire undergoes rupture. The experimenter may, through this graph and according to the material and the temperature of the annealing that determine the coefficient B, quantify $r_{neck}$ (that is to say the magnitude of the necking) and thus prevent rupture of the wire. This graph is general for all materials with a known coefficient B. The characteristic rupture time $t_r$ is obtained from the above results for 0.95 $r_0^4/B$.

Figure 7:
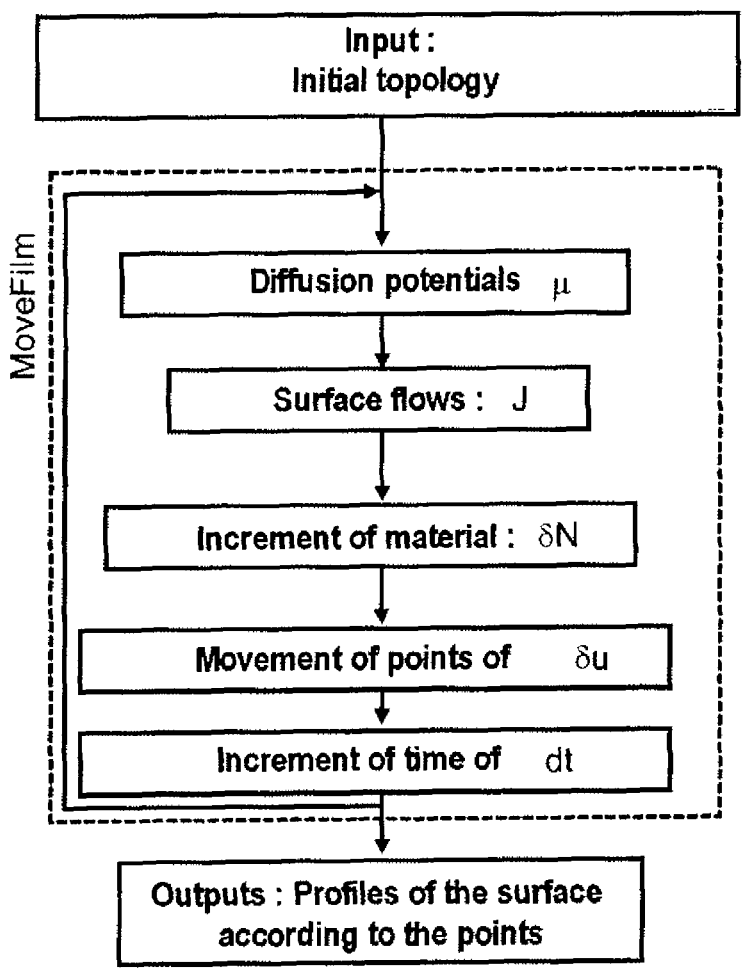
FIG. 7 depicts the algorithm of the MoveFilm numerical code applied to a free nanowire.

The details of the code applied to the simulation of the annealing effect of the nanowires will now be disclosed. This numerical tool simulates the changes in the surface of the nanowire and the contacts by surface diffusion. The details of the numerical code applied to films are described in the article by E. Dornel et al, cited above. The main steps of the Move-Film numerical tool applied to the free nanowire having an axis of symmetry by rotation will be detailed. The surface is rendered discrete in points of coordinates (r,z), where r is the distance to the axis of symmetry z of the nanowire. The algorithm of this numerical code consists of a succession of 5 steps: calculation of the potentials $\mu_i$ at each point, calculation of the flows of material $J_i$ between each point $M_i$ and $M_{i+1}$ and calculation of the increments of material $\delta N_i$ attributed at each point $M_i$, then the points are moved and finally the time is incremented by a time step dt (see FIG. 7).

Let $(r_{i-1}, z_{i-1})$, $(r_i, z_i)$ and $(r_{i+1}, z_{i+1})$ be the respective coordinates of the point $M_{i-1}$, $M_i$, and $M_{i+1}$ of the surface. The calculations of these quantities (that is to say potentials, flows, increments of material movement) have been reformulated compared with the teaching of the article by E. Dornel et al. cited above. The potential $\mu_i$ is calculated as the ratio of the variation in the surface to the variation in the volume, imagining an accretion of local material at the point $M_i$, that is to say:

$$\mu_i = 3\gamma\Omega \frac{K_{1,i}\left[\frac{1}{l_i}(r_{i+1}+r_i)(z_{i+1}-z_i) - \frac{1}{l_{i-1}}(r_i+r_{i-1})(z_i-z_{i-1})\right]}{K_{2,i}[(z_{i+1}-z_i)(2r_i+r_{i+1})+(z_i-z_{i-1})(2r_i+r_{i-1})] + K_{1,i}[(r_{i-1}-r_{i+1})(r_{i+1}+r_i+r_{i-1})]} + K_{2,i}\left[\frac{r_{i+1}^2-r_i^2}{l_i} - \frac{r_i^2-r_{i-1}^2}{l_{i-1}} - l_i - l_{i-1}\right] +$$

where:

$l_i = \sqrt{(r_{i+1}-r_i)^2+(z_{i+1}-z_i)^2}$ $K_{1,i}=(r_{i+1}-r_{i-1})(r_{i+1}+r_i+r_{i-1})$ $K_{2,i}=-2r_i(z_{i+1}-z_{i-1})+z_i(r_{i+1}-r_{i-1})-z_{i+1}r_{i+1}+z_{i-1}r_{i-1}$ The flow is proportional to the surface derivative of the potential, that is to says between the points $M_i$ and $M_{i+1}$:

$$J_i = -\frac{D_s v}{k_B T} \cdot \frac{\mu_{i+1}-\mu_i}{l_i}$$

The increment of material $\delta N_i$ attributed to the point $M_i$ is determined by the conservation of the quantity of material, which amounts to all the flows passing through the circles of the surface of dimensions $z_{i-1}$ and $z_{i+1}$.

$$\delta N_i = \pi[(r_{i-1}+r_i)J_{i-1}-(r_i+r_{i+1})J_i]dt$$

The points $M_i$ are moved successively, so that this movement generates an increment of material equal to $\delta N_i$. In addition, the points are moved perpendicular to the iso-volume. The points $M_i$ are therefore moved by the vector $(\delta r_j, \delta z_i)$ so that:

$$\delta r_i = \frac{3\Omega\delta N_i}{\pi} \frac{N_{r,i}}{N_{z,i}K_{1,i} + N_{r,i}K_{2,i}}$$

$$\delta z_i = \frac{3\Omega\delta N_i}{\pi} \frac{N_{z,i}}{N_{z,i}K_{1,i} + N_{r,i}K_{2,i}}$$

where $(N_{r,i}, N_{z,i})$ are the coordinates of the vector normal to the iso-volume curve in $M_i$:

$$N_{r,i} = \frac{-K_{2,i}}{\sqrt{K_{1,i}^2 + K_{2,i}^2}} \text{ and: } N_{z,i} = \frac{-K_{1,i}}{\sqrt{K_{1,i}^2 + K_{2,i}^2}}$$

The invention also allows control of the location of the neck along the axis of the nanowire, that is to say along the axis z.

Figure 8:
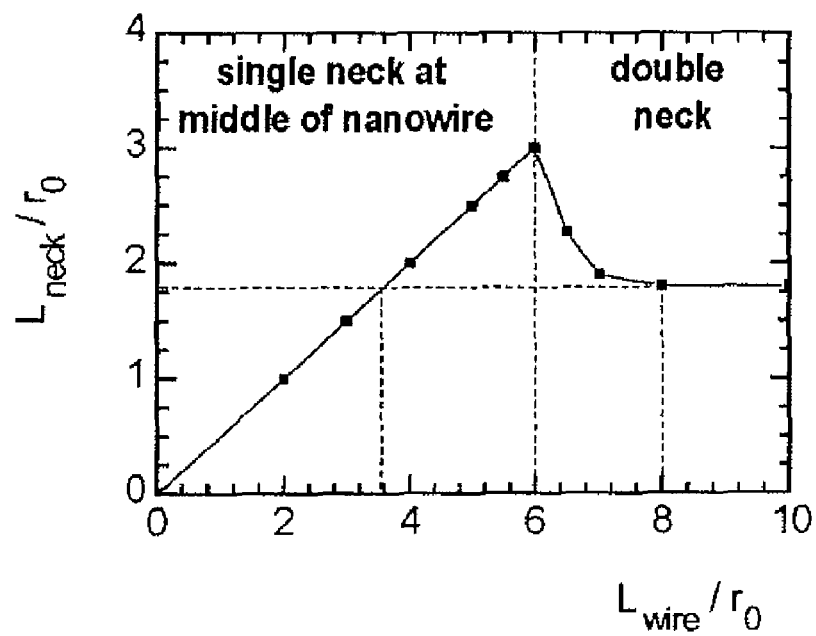
FIG. 8 is a graph depicting the distance $L_{neck}$ between the neck and the contact as a function of the length of the nanowire and its initial radius $r_0$.

In the case of a long wire (that is to say such that $L_{wire} > 8 r_0$ (see FIG. 5B), the neck is created at a distance $L_{neck}$ equal to approximately 1.9 times the initial radius of the wire ($r_0$) corresponding to the plateau reached for the high values of $L_{wire}/r_0$ in FIG. 8. This distance $L_{neck}$ can be adjusted by correctly sizing the ratio of the length of the wires $L_{wire}$ to the initial radius of the wires $r_0$.

In the zone where $L_{wire}$ is less than or equal to $6 r_0$, the neck is unique and is at equal distances from the contacts. This zone is interesting since it allows the alignment of the gate at equal distances from the contact, the place where the minimum radius of the wire is situated.

In the case were $L_{wire} > 6 r_0$, two necks are created, close to each contact.

The zone where $3.5 r_0 \leq L_{wire} \leq 8 r_0$ is particularly interesting in so far as the neck or necks created are distant from the contacts (that is to say $L_{neck} > 1.9 r_0$) compared with the case where the wire is long (that is to say with a length greater than $9 r_0$).

The invention also allows control of the location of the neck on the nanowire. The cases where $3.5 r_0 \leq L_{wire} \leq 6 r_0$ and $6 r_0 < L_{wire} \leq 8 r_0$ will be detailed.

Case where $3.5 r_0 \leq L_{wire} \leq 6 r_0$

Figure 9:
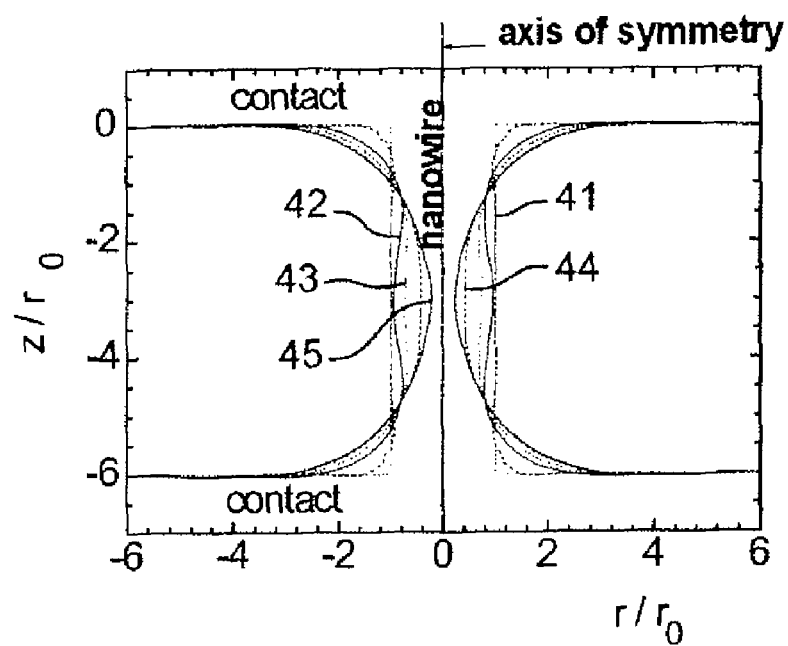
FIG. 9 is a diagram depicting the change in the profile of the surface of a free nanowire during annealing, as a function of time t, or the initial radius of the nanowire $r_0$ and the coefficient B, for $L_{wire}$=6 $r_0$.
Figure 10:
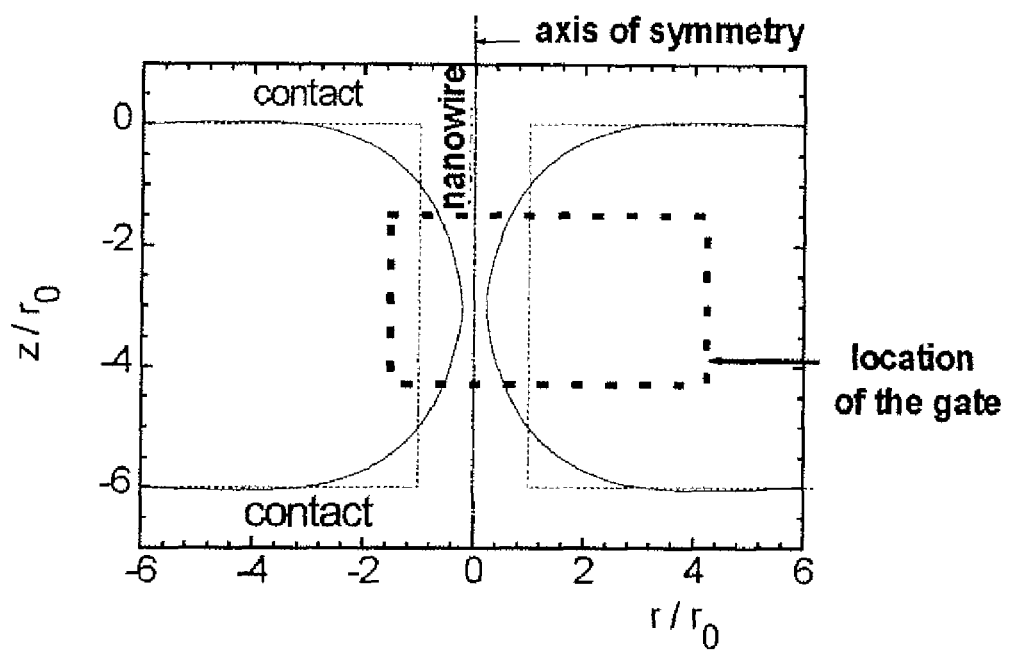
FIG. 10 is a diagram depicting the profile of the surface of a free nanowire of length $L_{wire}$=6 $r_0$, before and after annealing during a time t=0.97 $r_0^4$/B.

FIGS. 9 and 10 give an illustration for the case $L_{neck} = 6 r_0$. In the zone $3.5 r_0 \leq L_{wire} \leq 6 r_0$ the neck is the only one and is distant from the contact compared with the case where $L_{wire}$ is very large compared with $r_0$. Having a single neck makes it possible to manufacture the gate of the transistor at the minimum of the width of the wires and always at equal distances from the contacts. In addition, the fact that the neck is distant from the contacts makes it possible to manufacture a gate that is not flush with the contacts (and therefore not to add stray capacitances), without for all that degrading the access resistances since the neck is situated under the gate. Typically, the stray capacitances change according to $1/d^2$ where d is the distance between the contact and the gate. It is therefore important to increase d and therefore increase $L_{neck}$. Finally, the centre of the wire, where the gate is manufactured, has, after annealing, a finer radius than initially, which allows better electrostatic control of the current passing through the nanowire through the gate. For example, for $L_{wire} = 6 r_0$ and an annealing time $t = 0.97 \times B \cdot r_0^4$, the minimum of the radius of the nanowire is $0.22 r_0$ (the case in FIG. 8). For example, if the initial radius is equal to 10 nm, at the end of this annealing a radius at the constriction zone (that is to say the neck) of 2.2 nm would therefore be achieved. The fine zone of the wire allows better sensitivity after functionalisation of this zone.

In the end, a thinning of the wires at the centre of the space situated between the source and drain zones is obtained, using the known technique of annealing (see FIGS. 9 and 10). The advantages of the invention are therefore a reduction in the dimension of the wire and alignment of the gate at this minimum. In this way, the phenomenon of necking appears to be an advantage rather than a drawback.

In FIG. 9, the reference 41 designates the initial profile of the nanowire, and therefore for $t \cdot B/r_0^4 = 0$. The reference 42 designates the profile of the nanowire for $t \cdot B/r_0^4 = 0.3$. The reference 43 designates the profile of the nanowire for $t \cdot B/r_0^4 = 0.6$. The reference 44 designates the profile of the nanowire for $t \cdot B/r_0^4 = 0.9$. The reference 45 designates the profile of the nanowire for $t \cdot B/r_0^4 = 0.97$.

FIG. 10 is a diagram representing the profile of the surface of a free nanowire of length $L_{wire} = 6 r_0$, before and after annealing for a time $t = 0.97 B \cdot r_0^4$. As for FIG. 9, the reference 41 designates the initial profile of the nanowire and the reference 45 designates the profile of the nanowire after annealing for a time $t = 0.97 B \cdot r_0^4$. The optimal position of the gate is indicated by the reference 48. The gate is situated at the minimum of the width of the wires, which allows better control of the current by the gate. The parts of the nanowire broadened and close to the contacts are not under the gate, which minimises the access resistances.

The Case where $6 r_0 < L_{wire} \leq 8 r_0$

Figure 11:
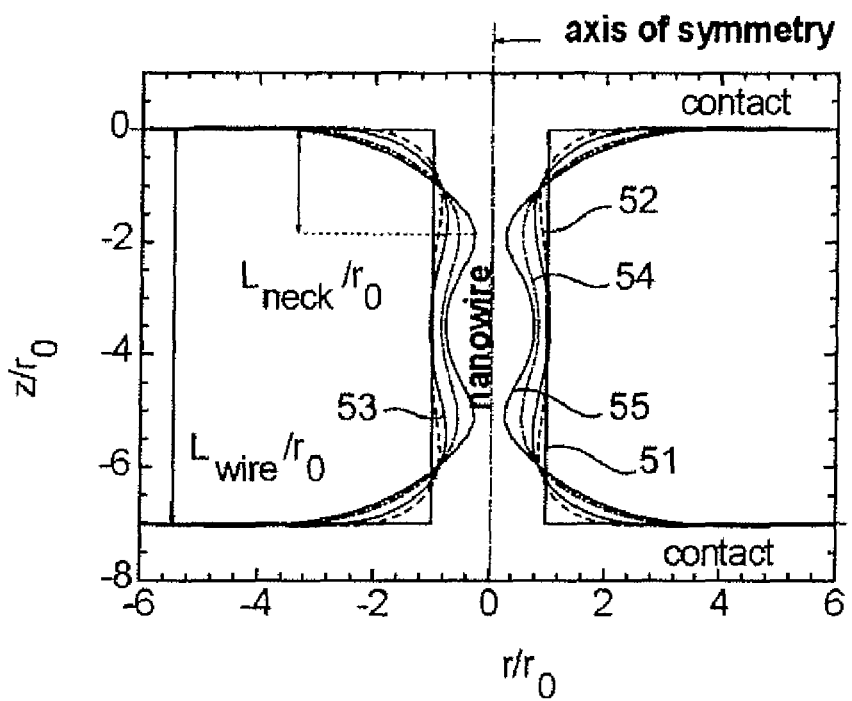
FIG. 11 is a diagram depicting the change in the profile of the surface of a free nanowire during annealing, as a function at the time t, the initial radius of the nanowire $r_0$ and the coefficient B, for $L_{wire}$=7 $r_0$.

FIG. 11 is a diagram representing the change in the profile of the surface of a free nanowire during annealing, as a function of the time t, the initial radius of the nanowire $r_0$ and the coefficient B, for $L_{wire} = 7 r_0$.

In FIG. 11, the reference 51 designates the initial profile, and therefore for $t \cdot B/r_0^4 = 0$. The reference 52 designates the profile of the nanowire for $t \cdot B/r_0^4 = 0.1$. The reference 53 designates the profile of the nanowire for $t \cdot B/r_0^4 = 0.3$. The reference 54 designates the profile of the nanowire for $t \cdot B/r_0^4 = 1$. The reference 55 designates the profile of the nanowire $t \cdot B/r_0^4 = 1.4$.

In the zone $6 r_0 < L_{wire} \leq 8 r_0$, the neck is double and is distant from the contact compared with the case where $L_{wire}$ is very large compared with $r_0$. The advantage of having a large $L_{neck}$ has already been discussed. The advantage of having in this case two necks while having $L_{neck}$ large is to be able to have two zones where the wire has a reduced radius, in order for example to manufacture two independent gates and to be able to control the quantity of current passing through the wire.

Figure 12:
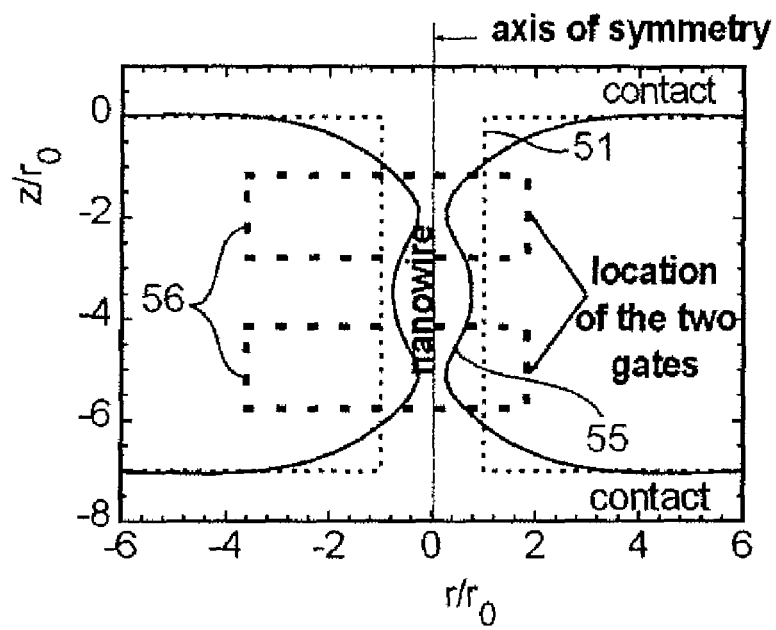
FIGS. 12 and 13 are diagrams depicting the profile of the surface of a free nanowire of length $L_{wire}$=7 $r_0$, before and after annealing during a time t=1.4 $r_0^4$/B.
Figure 13:
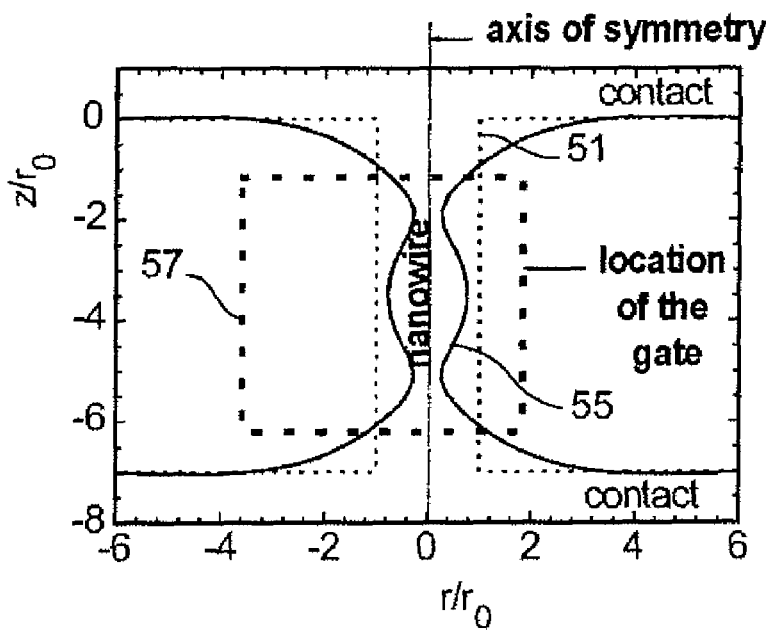

FIGS. 12 and 13 are diagrams depicting the profile of the surface of free nanowire of length $L_{wire} = 7 r_0$, and after an annealing for a time $t = 1.4 \times r_0^4/B$. In these figures, as for FIG. 11, the reference 51 designates the initial profile of the nanowire and the reference 55 designates the profile of the nanowire for $t \cdot B/r_0^4 = 1.4$. In FIG. 12, the reference 56 designates the locations of two gates disposed in an optimum positioning. In FIG. 13, the reference 57 designates the location of a single gate disposed in an optimum position. The gates disposed on the locations 56 and 57 enclose the zone where the nanowire has a minimum radius, which affords better control of the current by the gate. The parts of the nanowire broadened and close to the contacts are not under the gate, which minimises the access resistances.

The advantage of having two necks close to each other is to be able to isolate a small quantity of material (the material between the two necks). Manufacturing a single gate covering the two neck zones would make it possible to obtain an effect of the transistor type with one or more electrons (see FIG. 13).

Finally, a thinning of the nanowires at the centre of the space situated between the source and drain zones is obtained, using the known technique of annealing. The advantages of the invention are therefore a local reduction in the dimension of the nanowire at two places separated by a place where the nanowire has a larger radius. In this way, the pinching phenomena appear to be an advantage rather than a drawback.

From the above considerations and by virtue of the numerical tool used by the inventors, the latter have arrived at the conclusion that the modification of the curvature between the nanowire and its contacts makes it possible to push back the rupture time. This is illustrated by FIGS. 14A and 14B, which depict attachment zones between nanowires and their corresponding contact according to the known art (FIG. 14A) and according to the invention (FIG. 14B).

Figure 14A:
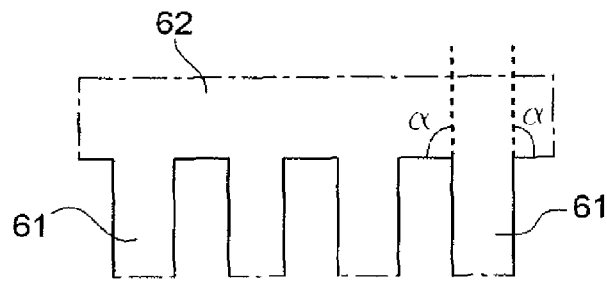
FIGS. 14A and 14B depict zones of attachment between nanowires and their corresponding contact, according to the known art (FIG. 14A) and according to the invention (FIG. 14B)

FIG. 14A shows nanowires 61 attached to their contact 62 at an angle $\alpha$ forming 90°. FIG. 14B shows nanowires 71 attached to their contact 72 at an angle $\alpha$ forming 45°: the shape of the nanowires is therefore splayed in its connection with their contact. Under these conditions, the rupture time of a nanowire is pushed back by a factor greater than 2 as illustrated in FIG. 15.

Figure 14B:
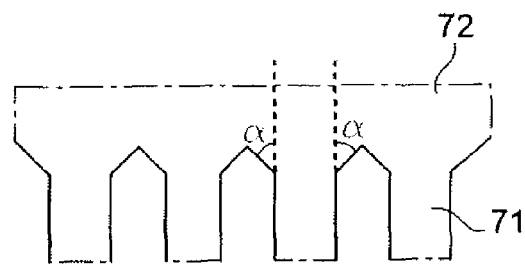
Figure 15:
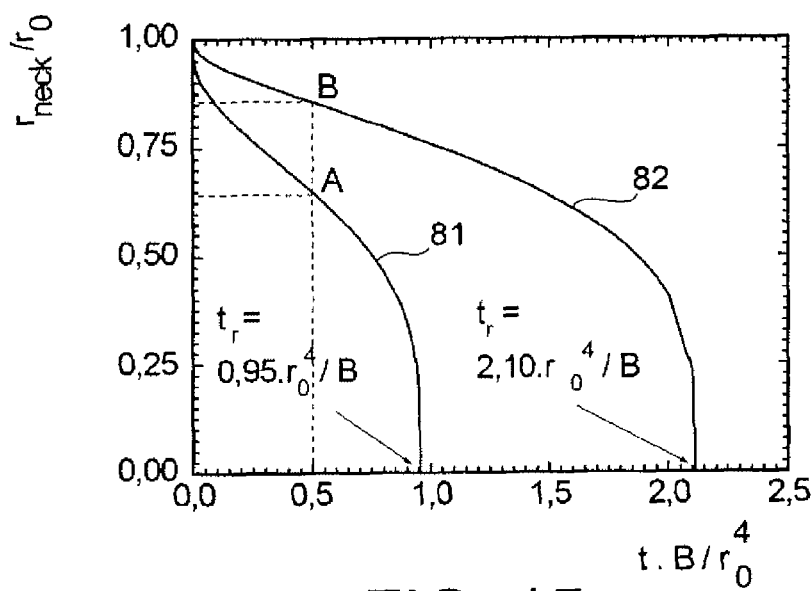
FIG. 15 is a graph depicting the minimum of the radius of the nanowire at the neck, $r_{neck}$, as a function of the time t, the coefficient B and the initial radius of the nanowire $r_0$ for the geometries shown in FIGS. 14A and 14B.

This FIG. 15 is a graph showing the minimum of the radius of the nanowire at the neck, $r_{neck}$, as a function of the time t, the coefficient B and the initial radius of the nanowire $r_0$ for the geometries shown in FIGS. 14A and 14B. The time $t_r$ represents a time where $r_{neck}=0$, that is to say the time corresponding to the rupture of the nanowires. It will be noted that, for the geometry shown in FIG. 14A ($\alpha$90°), the rupture time is $0.95\ r_0^4/B$ whereas for the geometry shown in FIG. 14B ($\alpha$=45°), the rupture time is $2.10\ r_0^4/B$.

The modification of the geometry close to the contacts thus makes it possible to push back the rupture time and enables the experimenter to choose the time and temperature of the annealing within less constraining ranges for which rupture is not caused by the annealing.

Another advantage is a gain on the technological variability. For example, for a time $0.5\ r_0^4/B$, a geometry at 90° according to FIG. 14A will cause a necking of $0.65\ r_0$, whereas at this same time a geometry at 45° according to FIG. 14B will cause a necking of only $0.85\ r_0$ (see points A and B on the graph in FIG. 15).

The invention claimed is:

1. Method of manufacturing at least one nanowire on a supporting substrate, the nanowire being parallel to said supporting substrate, the method comprising:
    a step of formation on the supporting substrate of a structure comprising a bar of length $L_{wire}$ and two regions, a first end of the bar being secured to one of the two regions and a second end of the bar being secured to the other region, the width of the bar being less than the width of the regions,
    a step of subjection of the bar to annealing under gaseous atmosphere in order to transform the bar into a nanowire of radius $r_0$, the annealing being carried under conditions allowing formation of at least one necking occurring on the nanowire during the transformation of the bar into a nanowire, the two regions being uncovered during the step of subjection,
    determining the dimensions of the bar prior to the bar being formed on the substrate from the ratio $L_{wire}/r_0$, this ratio being less than 6 if a single necking is desired, this ratio being greater than 6 if a double necking is desired.

2. Method of manufacturing according to claim 1, wherein a single necking being desired, the ratio $L_{wire}/r_0$ is comprised between 3.5 and 6.

3. Method of manufacturing according to claim 1, wherein a double necking being desired, the ratio $L_{wire}/r_0$ is comprised between 6 and 8.

4. Method of manufacturing at least one nanowire according to claim 1, in which the formation on the supporting substrate of the structure comprising a bar and two regions causes the creation of a splay at each end of the bar in its connection with the two regions.

5. Method of manufacturing at least one nanowire according to claim 4, in which the splay takes place at an angle of 45° on each edge of the nanowire.

6. Method of manufacturing a nanowire transistor, further comprising:
    designing one of the regions of the structure manufactured by the method of claim 1, to form the drain of the transistor, and designing the other region of the structure to form the source of the transistor, forming at least one gate for the transistor on the nanowire at the location of said at least one necking.

7. The manufacturing method of claim 6, wherein a nanowire transistor has a single necking and a single gate covering the single necking.

8. The manufacturing method of claim 6, wherein the nanowire transistor has two neckings and a single gate covering the two neckings.

9. The manufacturing method of claim 6, wherein the nanowire transistor has two neckings and two gates, a first gate covering a first necking and a second gate covering a second necking.

* * * * *